(12) United States Patent
Pletenetskyy (10) Patent No.: US 10,001,683 B2
(45) Date of Patent: Jun. 19, 2018

(54) LOW-PROFILE MICRODISPLAY MODULE

(71) Applicant: Microsoft Technology Licensing, LLC, Redmond, WA (US)

(72) Inventor: Andriy Pletenetskyy, Mountain View, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days. days.

(21) Appl. No.: 14/935,200

(22) Filed: Nov. 6, 2015

(65) Prior Publication Data

US 2017/0131581 A1 May 11, 2017

(51) Int. Cl.
| | |
|---|---|
| *H01L 33/00* | (2010.01) |
| *G02F 1/1347* | (2006.01) |
| *G02F 1/1345* | (2006.01) |
| *H01L 23/498* | (2006.01) |
| *H01L 23/00* | (2006.01) |
| *H01L 21/48* | (2006.01) |

(Continued)

(52) U.S. Cl.
CPC .......... *G02F 1/1347* (2013.01); *G02F 1/1345* (2013.01); *G02F 1/13452* (2013.01); *H01L 21/486* (2013.01); *H01L 23/04* (2013.01); *H01L 23/053* (2013.01); *H01L 23/055* (2013.01); *H01L 23/057* (2013.01); *H01L 23/13* (2013.01); *H01L 23/32* (2013.01); *H01L 23/4922* (2013.01); *H01L 23/49811* (2013.01); *H01L 23/49827* (2013.01); *H01L 23/49838* (2013.01); *H01L 23/5226* (2013.01); *H01L 23/535* (2013.01); *H01L 23/562* (2013.01);

(Continued)

(58) Field of Classification Search
CPC ... H05K 1/147; G02F 1/13452; G02F 1/1345; G02F 1/13458; H01L 23/5226; H01L 23/053; H01L 23/055; H01L 23/057; H01L 23/0522; H01L 23/535; H01L 23/4922; H01L 23/32; H01L 23/04; H01L 23/13; H01L 23/562
See application file for complete search history.

(56) References Cited

U.S. PATENT DOCUMENTS

| | | |
|---|---|---|
| 6,211,936 B1 | 4/2001 | Nakamura |
| 6,521,475 B1 | 2/2003 | Chen et al. |

(Continued)

FOREIGN PATENT DOCUMENTS

| | | |
|---|---|---|
| CN | 104269346 A | 1/2015 |
| WO | 179921 A2 | 10/2001 |

OTHER PUBLICATIONS

Bleha, et al., "Binocular Holographic Waveguide Visor Display", In SID Symposium Digest of Technical Papers, vol. 45, Issue 1, Jun. 2014, 4 pages.

(Continued)

*Primary Examiner* — Jesse Y Miyoshi
(74) *Attorney, Agent, or Firm* — Arent Fox LLP (57) ABSTRACT

Disclosed is a low-profile microdisplay module that comprises a package substrate, a microdisplay chip disposed over a first surface of the package substrate, and a plurality of conductive vias. The plurality of conductive vias are electrically coupled to the microdisplay chip and disposed through the package substrate to a second surface of the package substrate, the second surface being opposite and parallel to the first surface. The microdisplay module further comprises a flexible flat circuit connector coupled to the plurality of conductive vias at the second surface of the package substrate.

4 Claims, 6 Drawing Sheets

(51) Int. Cl.
*H01L 23/522* (2006.01)
*H01L 23/055* (2006.01)
*H01L 23/057* (2006.01)
*H01L 23/053* (2006.01)
*H01L 23/535* (2006.01)
*H01L 23/13* (2006.01)
*H01L 23/492* (2006.01)
*H01L 23/32* (2006.01)
*H01L 23/04* (2006.01)
*G02F 1/1362* (2006.01)

(52) U.S. Cl.
CPC .............. *H01L 24/05* (2013.01); *H01L 24/49* (2013.01); *H01L 24/85* (2013.01); *G02F 1/136277* (2013.01); *G02F 2001/13478* (2013.01); *G02F 2201/42* (2013.01); *G02F 2202/28* (2013.01); *H01L 2224/04042* (2013.01); *H01L 2224/48091* (2013.01); *H01L 2224/48227* (2013.01)

(56) References Cited

U.S. PATENT DOCUMENTS

| | | | |
|---|---|---|---|
| 6,828,595 B2 | 12/2004 | Leng | |
| 7,289,186 B2 | 10/2007 | Lin | |
| 7,474,371 B2 | 1/2009 | Wu | |
| 8,681,301 B2 | 3/2014 | Tsai | |
| 8,870,390 B2 | 10/2014 | Davidson | |
| 2002/0085158 A1 | 7/2002 | Armagost et al. | |
| 2002/0113772 A1 | 8/2002 | Edwards et al. | |
| 2006/0189119 A1* | 8/2006 | Jin | G02F 1/13452 438/617 |
| 2009/0140757 A1 | 6/2009 | Shih et al. | |
| 2010/0039603 A1 | 2/2010 | Chen et al. | |
| 2014/0085579 A1 | 3/2014 | Fan | |
| 2014/0203703 A1* | 7/2014 | Maatta | H01L 23/3121 313/504 |

OTHER PUBLICATIONS

Bleha, et al., "Advances in Liquid Crystal on Silicon (LCOS) Spatial Light Modulator Technology", In Proceedings of SPIE Display Technologies and Applications for Defense, Security, and Avionics VII, Jun. 4, 2013, 8 pages.

"International Preliminary Report on Patentability Issued in PCT Application No. PCT/US2016/060068", dated Oct. 6, 2017, 9 Pages.

"International Search Report and Written Opinion Issued in PCT Application No. PCT/US2016/060068", dated Feb. 13, 2017, 19 Pages.

* cited by examiner

LOW-PROFILE MICRODISPLAY MODULE

BACKGROUND

Microdisplay technologies such as LCOS (Liquid Crystal on Silicon) are commonly used in small-scale display systems to generate images. Examples of such systems include handheld projectors (also called "pico-projectors") and head-mounted display (HMD) devices. In such systems, the internal space available for various components is often extremely limited.

SUMMARY

The technology introduced here includes a low-profile microdisplay module that is particularly suited for use in small-scale display systems that have very limited internal space. In certain embodiments, the microdisplay module comprises a package substrate, a microdisplay chip disposed over a front surface of the package substrate, and a plurality of conductive vias. The plurality of conductive vias are electrically coupled to the microdisplay chip and disposed through the package substrate to a back surface of the package substrate. The microdisplay module further comprises an electrical connector coupled to the plurality of conductive vias at the second surface of the package substrate.

Other aspects of the technique will be apparent from the accompanying figures and detailed description.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

One or more embodiments of the present disclosure are illustrated by way of example and not limitation in the figures of the accompanying drawings, in which like references indicate similar elements.

DETAILED DESCRIPTION

In this description, references to "an embodiment," "one embodiment" or the like, mean that the particular feature, function, structure or characteristic being described is included in at least one embodiment of the technique introduced here. Occurrences of such phrases in this specification do not necessarily all refer to the same embodiment. On the other hand, the embodiments referred to also are not necessarily mutually exclusive.

The technology introduced here includes a low-profile microdisplay module that is particularly well-suited for use in small-scale display systems that have very limited internal space, such as HMD devices, pico-projectors, etc. Stated briefly, the design introduced here allows a flexible circuit connector to be connected to the back of the package substrate of the microdisplay module, rather than the front surface, thereby reducing the required surface area of the package substrate and the overall size of the microdisplay module.

To facilitate description, the low-profile microdisplay module introduced below is based on LCOS technology. In other embodiments, however, it may be based on a different type (or types) of microdisplay technology, such as liquid crystal display (LCD), light emitting diode (LED), organic light emitting diode (OLED), digital micromirror device (DMD), etc. The terms "microdisplay module" and "microdisplay chip," as used herein, mean a module or chip, respectively, that includes one or more elements having light reflection and/or transmission characteristics that are dynamically changeable during operation based on input image data signals, to produce an image.

A conventional LCOS microdisplay module design features a flexible flat circuit connector, sometimes called "flex circuit" (or simply, "flex") that exits straight out of the LCOS module in approximately the same plane as the display surface, to connect the module to external display control component(s), e.g., a display processor. This design may be disadvantageous, however, when the microdisplay module needs to be mounted within a very small space. An example of this microdisplay module design is illustrated in FIG. 1.

Figure 1:
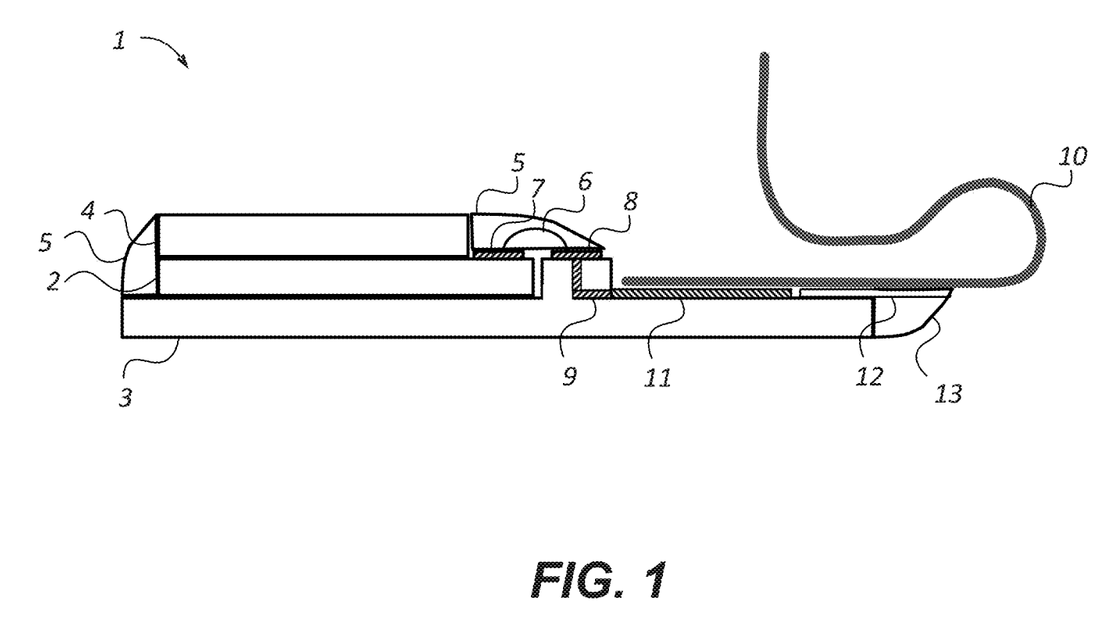
FIG. 1 shows a cross-sectional view of a conventional LCOS microdisplay module.

FIG. 1 shows a cross-sectional view of a conventional LCOS microdisplay module 1. In practice, the microdisplay module 1 may contain additional layers, not shown, that are not germane to this description and have been omitted from the figure for the sake of clarity (e.g., an alignment layer, reflective layer, etc.). The illustrated conventional design includes a silicon die (chip) 2 mounted over at least a portion of a front surface of a package substrate 3. The term "over" in this context means that the silicon die 2 is mounted directly or indirectly on the package substrate 3; that is, there may be one or more intervening layers (not shown) between the semiconductor die 2 and the package substrate 3. Note that when referring to surfaces in this description, the terms "front" and "top" are used interchangeably to refer to a microdisplay module's surface(s) that face the direction in which light from a corresponding light source will impinge on the display surface of the microdisplay module. Similarly, the terms "back," "rear" and "bottom" are used interchangeably to refer to any surface on the opposite side of the microdisplay module from its front or top surface(s).

A glass layer 4 is disposed over at least a portion of the top surface of the silicon die 2. In use, the top surface 4a of the glass layer 4 is the display surface, i.e., the surface through which light from one or more light sources (e.g., LEDs) initially impinges upon the LCOS device and is selectively reflected by the LCOS device to generate an image. The silicon die 2 and glass layer 4 are at least partially encased by an encapsulant layer 5. A number of wire bonds 6 are connected from wire bonds contact pads 7 on the silicon die to corresponding wire bond contact pads 8 on another top surface of the package substrate 3.

The contact pads 8 on the package substrate 3 are electrically connected through metal vias 9 to yet another additional top surface of the package substrate 3 (i.e., another surface parallel to the surface over which the silicon die 2 is mounted). This additional top surface provides an extension of surface area of the package substrate, to which a flex circuit connector 10 is connected. One end of the flex circuit connector 10 is electrically connected to anisotropic conductive film (ACF) pads 11 on this additional surface, and the ACF pads 11 are electrically connected to the metal vias 9 on the surface. The other end (not shown) of the flex circuit connector 10 can be connected to one or more electronic components (not shown) within the system in which the microdisplay module 1 is installed. A length of the flex circuit connector 10 adjacent to the ACF pads 11 is laid flat on the top surface of the package substrate 3 and fixed to the top surface by an adhesive layer 12. The adhesive bond relieves stress on the ACF joint when the flex circuit connector 10 is bent or otherwise acted upon by a force. Another encapsulant layer 13 encases the edge of the package substrate 3.

The design of FIG. 1 requires the package substrate 3 to have a relatively large surface area to allow for attachment of the flex circuit connector 10; further, the flex circuit connector 10 projects beyond the right edge of the module 1 in the plane parallel to that surface. When used in a display system with very limited internal space, this design may undesirably cause the flex circuit connector 10 to come into physical contact with nearby external components in the display system or to have insufficient physical clearance from such nearby components. That, in turn, may reduce component life spans, cause unexpected component failure and/or complicate assembly and testing of the display system.

Accordingly, introduced here is a design for a low-profile microdisplay module that addresses these disadvantages. The design allows the flex circuit connector to be connected to the back (bottom) surface of the microdisplay module's package substrate, thereby reducing the required surface area of the package substrate and the overall size of the microdisplay module. An example of such a design is illustrated in cross-section in FIG. 2. In practice, the low-profile microdisplay module 21 may contain additional layers, not shown, that are not germane to this description and have been omitted from the figure for the sake of clarity (e.g., an alignment layer, reflective layer, etc.).

Figure 2:
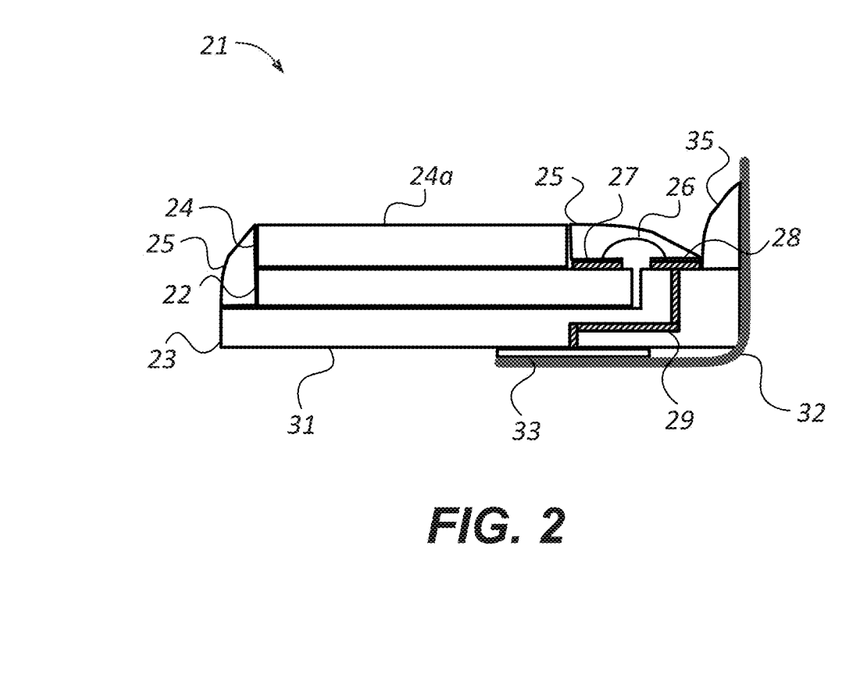
FIG. 2 shows a cross-sectional view of a low-profile LCOS microdisplay module.

The low-profile microdisplay module 21 of FIG. 2 includes a silicon die 22 mounted over at least a portion of a front (top) surface of a package substrate 23. The term "over" in this context means that the silicon die 2 is mounted directly or indirectly on the package substrate 3; that is, there may be one or more intervening layers (not shown) between the semiconductor die 2 and the package substrate 3. The package substrate 23 may be made of ceramic, for example. A glass layer 24 is disposed over at least a portion of the front surface of the silicon die 22. In use, the front surface 24a of the glass layer 24 is the surface through which light from one or more light sources (e.g., LEDs) initially impinges upon the LCOS device and is selectively reflected from the LCOS device to generate an image.

A number of wire bonds 26 are connected between wire bonds contact pads 27 on the silicon die 22 and corresponding wire bonds contact pads 28 on another front (top) surface the package substrate 23. The silicon die 22 and glass layer 24 are at least partially encased by an encapsulant layer 25 disposed on one or more front surfaces of the package substrate 23. Wire bonds 26 and wire bond contact pads 27 and 28 are also encased in the encapsulant layer 25.

The contact pads 28 on the package substrate 23 are electrically connected to metal vias 29. In contrast with the design of FIG. 1, however, the metal vias 29 are formed so that they pass from wire bond contact pads 28 completely through a thickness of the package substrate 23 to the back (bottom) surface 31 of the package substrate 23, rather than to another front (top) surface of the package substrate 23. This construction eliminates the need to extend the surface area of the package substrate 23 for attachment of the flex circuit connector 32. Instead, an end of the flex circuit connector 32 is electrically connected to ACF pads 33 on the back surface 31 of the package substrate 23, and the ACF pads 33 are electrically connected to the metal vias 29 on the back surface 31 of the package substrate 23. A portion of the flex circuit connector 32 adjacent to the ACF pads 33 is laid along the back surface of the package substrate and curled around a side 34 of the package substrate 23, perpendicular to the front and back surfaces. Another end (not shown) of the flex circuit connector 32 can be connected to one or more electronic components (not shown) within the display system in which the microdisplay module 21 is installed. The flex circuit connector 32 is held in place by another encapsulant layer 35 that is disposed along the edge of a top surface of the package substrate 23 and that adheres to the flex circuit connector 32.

The flex circuit connector 32 in the illustrated embodiment has a 90-degree bend at the edge of the package substrate 23, from the back surface 31 to the side surface 34 of the package substrate 23, after which the flex circuit connector 32 extends beyond the top of the glass layer 24 perpendicularly to the top surfaces of the package substrate 23.

Figure 3A:
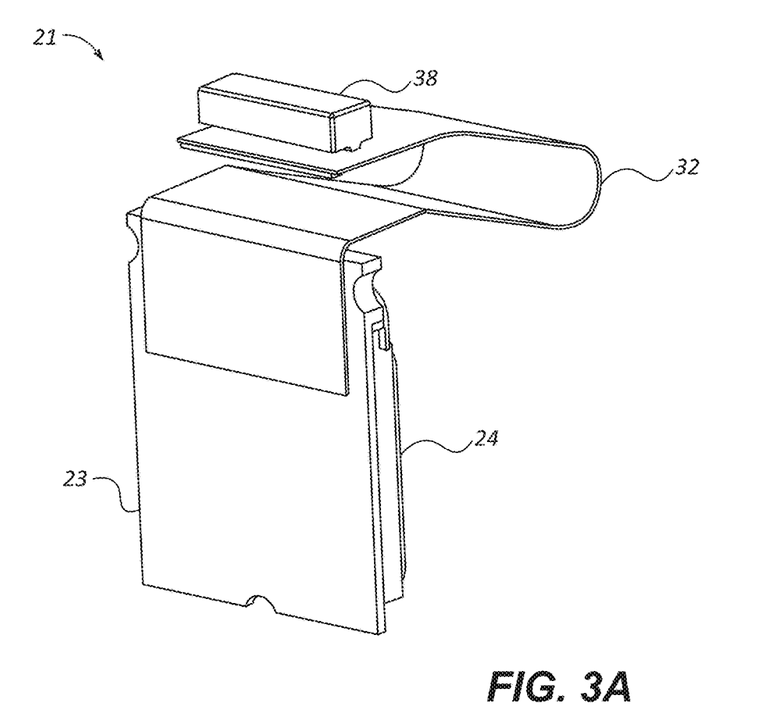
FIGS. 3A and 3B show example rear and front perspective views, respectively, of the microdisplay module of FIG. 2.
Figure 3B:
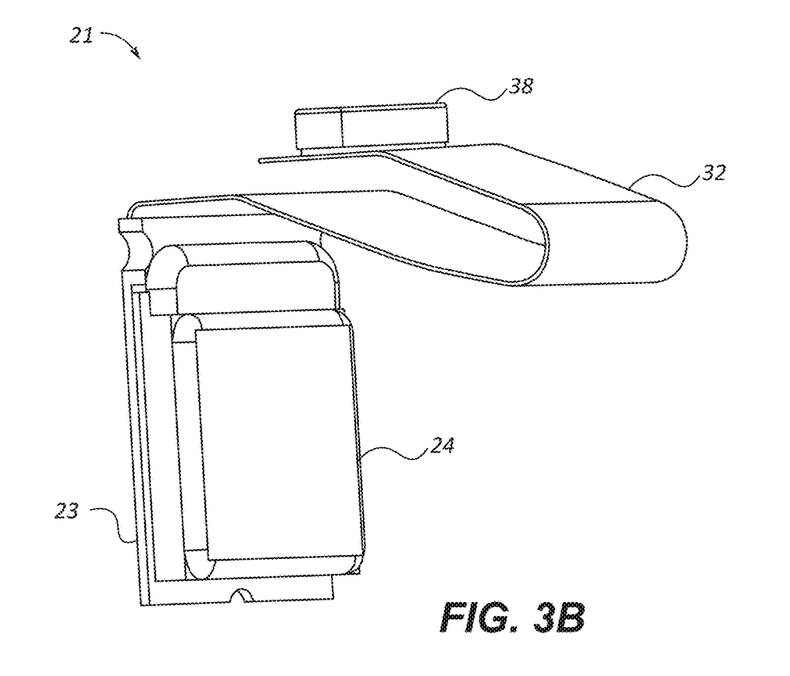

FIGS. 3A and 3B show example rear and front perspective views, respectively, of the microdisplay module 21 of FIG. 2. Note that the microdisplay module 21 is shown in an orientation that is rotated 90 degrees relative to that shown in FIG. 2. In the illustrated embodiment, an electrical socket connector 38 is mounted on the end of the flex circuit connector 32 opposite to the end that is attached to the package substrate 23.

Figure 4:
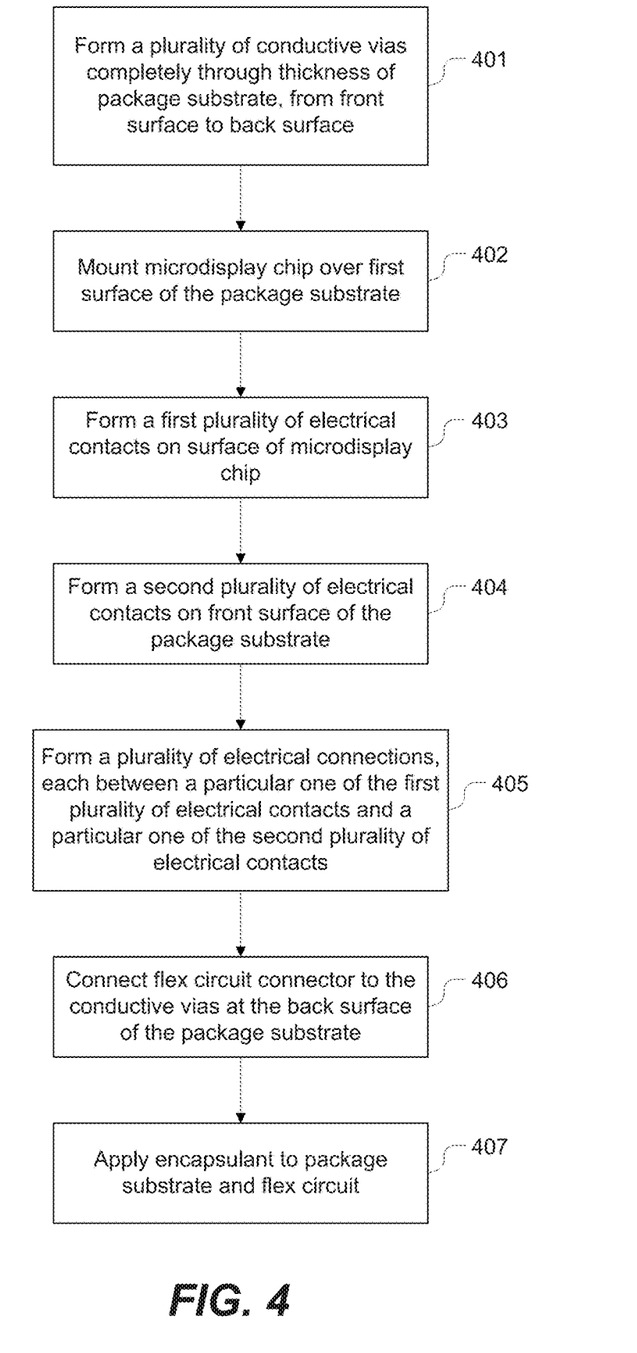
FIG. 4 shows an example of a process for fabricating a low-profile microdisplay module.

FIG. 4 shows an example of a process for fabricating a low-profile microdisplay module consistent with FIGS. 2, 3A and 3B. Note that in some embodiments, the sequence of steps may be different from that illustrated in FIG. 4. Further, in some embodiments, one or more of the steps of FIG. 4 may be omitted and/or additional steps may be performed. Initially, at step 401 a plurality of conductive vias (e.g., vias 29) are formed completely through a thickness of the package substrate (e.g., package substrate 23), from a front (top) surface of the package substrate to a back (bottom) surface of the package substrate. Next, at step 402 the microdisplay chip (e.g., silicon die 22) is mounted over a first top surface of the package substrate. A first plurality of electrical contacts (e.g., contacts 28) are then formed on the surface of the microdisplay chip at step 403. A second plurality of electrical contacts (e.g., contacts 28) are formed on the front surface of the package substrate at step 404. At step 45, a plurality of electrical connections (e.g., wire bonds 26), are formed, each between a particular one of the first plurality of electrical contacts and a particular one of the second plurality of electrical contacts. A flex circuit connector and connected to the conductive vias at the back surface of the packet substrate at step 406. Finally, an encapsulant layer (e.g., layer 35) is applied to the front surface of the package substrate and two the flex circuit connector at step 407.

Figure 5:
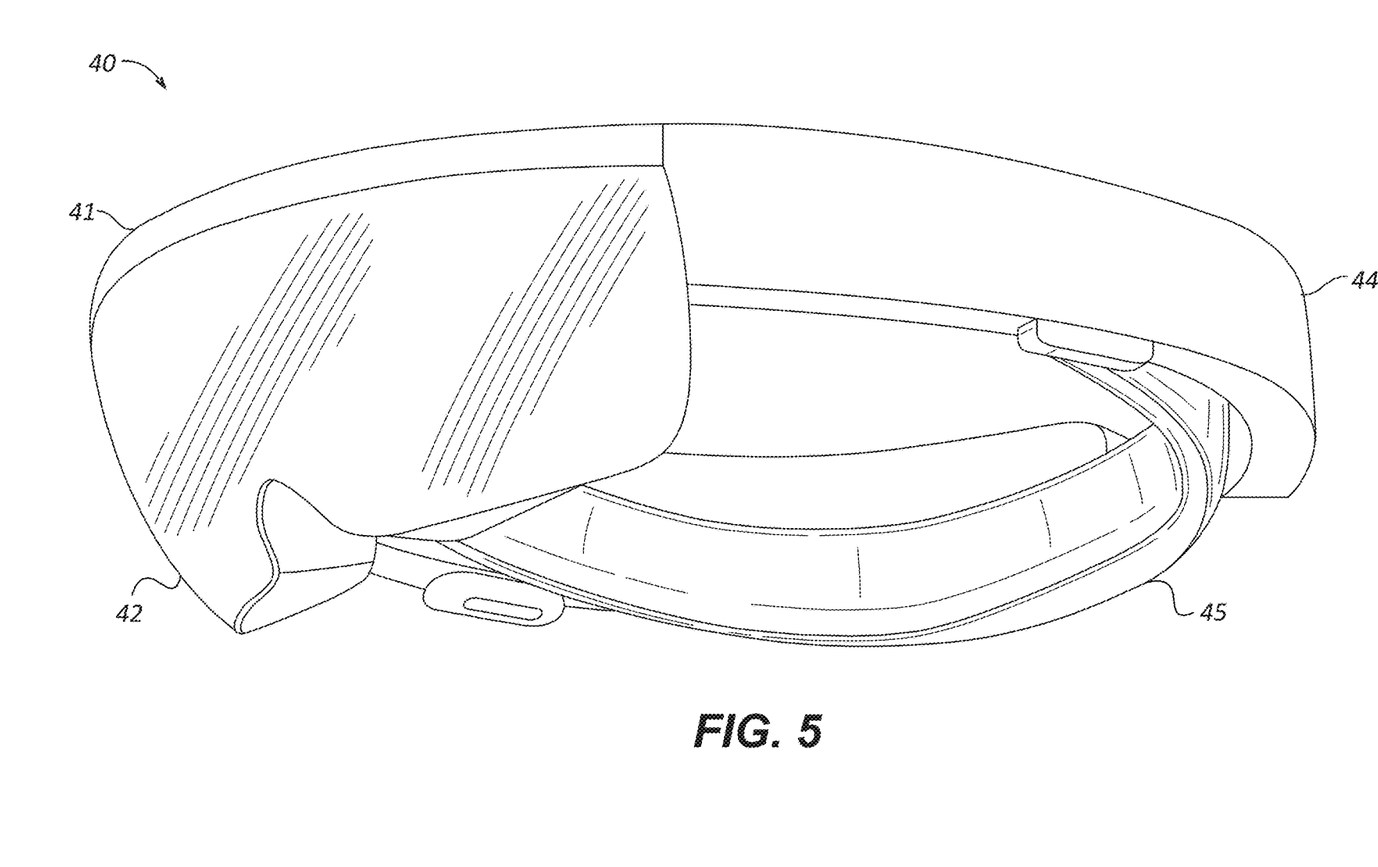
FIG. 5 illustrates an example of an HMD device that can incorporate a low-profile microdisplay module.

A low-profile microdisplay module such as described above in reference to FIGS. 2, 3A and 3B can be incorporated within essentially any kind of product that uses microdisplay elements. Examples of such products include pico projectors and HMD devices. FIG. 5 illustrates an example of an HMD device in which a low-profile microdisplay module such as described above can be incorporated.

The HMD device 40 of FIG. 5 may provide virtual reality (VR) and/or augmented reality (AR) display modes. In the illustrated embodiment, the HMD device 40 includes a chassis 41, a transparent protective visor 42 mounted to the chassis 41, and left and right side arms 44 mounted to the chassis 41. The chassis 41 is the mounting structure for the visor 42 and side arms 44, as well as for various sensors and other components (not shown) that are not germane to this description. Also mounted to the chassis 41, and enclosed within the protective visor 42, is a display assembly 57 (FIGS. 6A and 6B) that can incorporate one or more low-profile microdisplay modules such as described above. The visor assembly 42 and/or chassis 41 may also house electronics (not shown) to control the functionality of the microdisplay module(s) and other functions of the HMD device 40. The HMD device 40 further includes an adjustable headband 45 attached to the chassis 41, by which the HMD device 40 can be worn on a user's head.

Figure 6A:
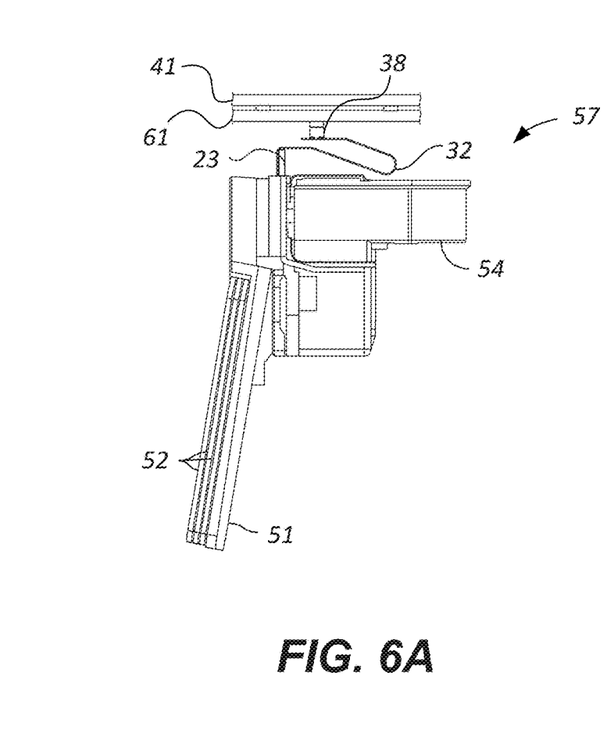
FIGS. 6A and 6B illustrate an example of a display assembly that can incorporate a low-profile microdisplay module and that can be included within the HMD device of FIG. 5.
Figure 6B:
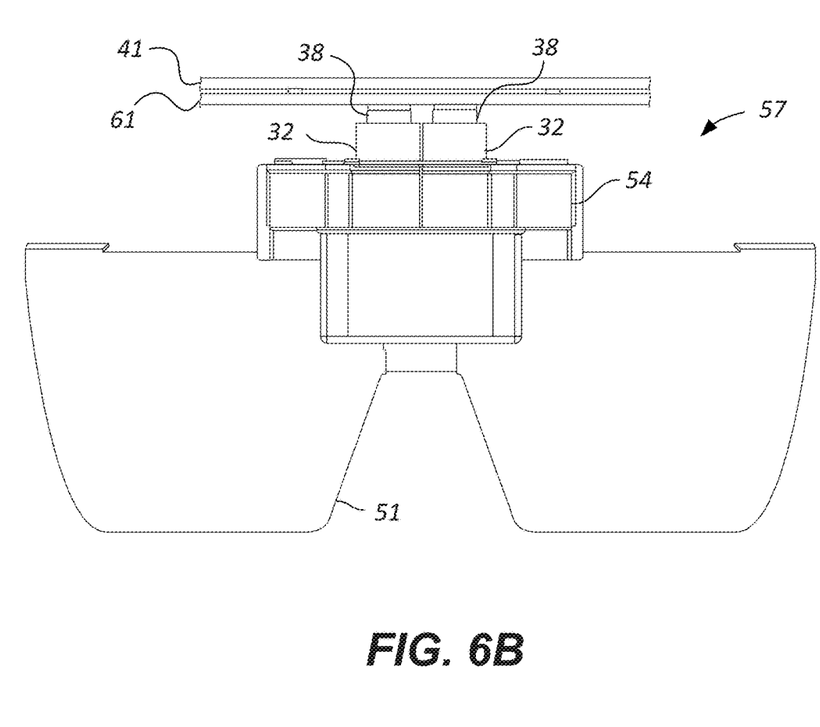

FIGS. 6A and 6B illustrate an example of the display assembly 57 housed within the visor 22, which incorporates low-profile microdisplay modules according to certain embodiments. Specifically, FIGS. 6A and 6B show orthogonal left side and front views, respectively, of the display assembly 57. The display assembly 57 is designed to overlay three-dimensional images on the user's view of his real-world environment, e.g., by projecting light into the user's eyes. Accordingly, the display assembly 57 includes a display engine assembly 54 that includes two low-profile microdisplay modules, such as two of microdisplay module 21 in FIGS. 2, 3A and 3B. The display engine assembly 54 may also house other display-related components, such as light sources (e.g., light-emitting diodes (LEDs)), lenses, beam splitters and/or additional waveguides, the details of which are not germane to this disclosure. The display assembly 57 further includes a waveguide carrier 51 to which the display engine assembly 54 is mounted, as well as multiple waveguides 52 for each of the left eye and right eye of the user.

In the illustrated embodiment, the two microdisplay modules 21 are mostly enclosed within the display engine assembly 54 (oriented substantially as shown in FIG. 3A or 3B) and are therefore mostly hidden from view in FIGS. 6A and 6B. Only a portion of the package substrates 23 of the microdisplay modules 21, as well as the flex circuit connectors 32 and socket connectors 38 of the microdisplay modules 21, extend outside the housing of the display engine assembly 54 and are visible in FIGS. 6A and 6B.

Socket connectors 38 on flex circuit connectors 32 connect to a circuit board 61 mounted to an inner surface of the chassis 41. The low-profile design of the microdisplay modules 21 enables them to be used in the HMD device 40 with very little spatial clearance between the microdisplay modules 21 and the circuit board 61.

EXAMPLES OF CERTAIN EMBODIMENTS

Certain embodiments of the technology introduced herein are summarized in the following numbered examples:

1. A microdisplay module comprising: a package substrate; a microdisplay chip disposed over a front surface of the package substrate; a plurality of conductive vias electrically coupled to the microdisplay chip and disposed through the package substrate to a back surface of the package substrate; and a flexible flat circuit connector coupled to the plurality of conductive vias at the back surface of the package substrate.

2. The microdisplay module of example 1, wherein the microdisplay chip is an LCOS chip.

3. The microdisplay module of example 1 or example 2, wherein the package substrate comprises a ceramic substrate.

4. The microdisplay module of any of examples 1 to 3, further comprising: a first plurality of electrical contacts disposed on a surface of the microdisplay chip that is parallel to the front surface of the package substrate; a second plurality of electrical contacts disposed on a particular surface of the package substrate, wherein the particular surface is the front surface or another surface of the package substrate that is parallel to the front surface; and a plurality of electrical connections, each connected between a particular one of the first plurality of electrical contacts and a particular one of the second plurality of electrical contacts.

5. The microdisplay module of any of examples 1 to 4, wherein each of the vias is coupled to a particular one of the second plurality of electrical contacts.

6. The microdisplay module of any of examples 1 to 5, further comprising an adhesive disposed along a first edge of the package substrate and affixed to the flexible flat circuit connector.

7. The microdisplay module of any of examples 1 to 6, wherein the adhesive holds the flexible flat circuit connector in a configuration in which the flexible flat circuit connector bends around a second edge of the package substrate, the second edge being an edge at which a side surface of the package substrate meets the back surface of the package substrate, the side surface being perpendicular to the front and back surfaces of the package substrate.

8. The microdisplay module of any of examples 1 to 7, wherein the adhesive holds the flexible flat circuit connector in a configuration in which a portion of the flexible flat circuit connector is substantially parallel to and proximate to the side surface of the package substrate.

9. The microdisplay module of any of examples 1 to 8, wherein the adhesive holds the flexible flat circuit connector in a configuration in which a portion of the flexible flat circuit connector extends beyond a top surface of the microdisplay chip in a direction substantially perpendicular to the front surface of the package substrate.

10. The microdisplay module of any of examples 1 to 9, wherein the flexible flat circuit connector is coupled to the plurality of conductive vias by a plurality of ACF pads.

11. A microdisplay module comprising: a package substrate; an LCOS microdisplay chip, including a silicon substrate, disposed over a first front surface of the package substrate; a first plurality of wire bond pads disposed on a surface of the silicon substrate that is parallel to the first front surface of the package substrate; a second plurality of wire bond pads disposed on a second front surface of the package substrate that is parallel to the first front surface; a plurality of wire bonds, each connected between a particular one of the first plurality of wire bond pads and a particular one of the second plurality of wire bond pads; a plurality of conductive vias, each coupled to a particular one of the second plurality of wire bond pads and disposed through the package substrate from the second front surface of the substrate to a back surface of the package substrate, the back surface being parallel to and opposite to the first front surface of the package substrate: a flexible flat circuit connector coupled to the plurality of conductive vias at the back surface of the package substrate; and an adhesive disposed along an edge of the second front surface of the package substrate and affixed to a portion of the flexible flat circuit connector, so as to cause the flexible flat circuit connector to bend around a side surface of the package substrate that is perpendicular to and contiguous with the back surface and the second front surface of the package substrate, the flexible flat circuit connector extending beyond the second front surface of the package substrate in a direction substantially perpendicular to the second front surface of the package substrate.

12. The microdisplay module of example 11, wherein the package substrate comprises ceramic substrate.

13. The microdisplay module of example 11 or example 12, wherein the flexible flat circuit connector is coupled to the plurality of conductive vias by a plurality of ACF pads.

14. A method comprising: forming a plurality of conductive vias completely through a thickness of a package substrate, from a particular front surface of the package substrate to a back surface of the package substrate, the back surface being parallel to the front surface; mounting a microdisplay chip over a first surface of the package substrate, wherein the first front surface is the particular front surface or another front surface parallel to the particular front surface; electrically connecting each of the vias to the microdisplay chip; and connecting a flexible flat circuit connector to the plurality of conductive vias at the back surface of the package substrate.

15. The method of example 14, wherein the microdisplay chip is an LCOS chip.

16. The method of example 14 or example 15, wherein the package substrate comprises a ceramic substrate.

17. The method of any of examples 1 to 16, wherein electrically connecting each of the vias to the microdisplay chip comprises: forming a first plurality of electrical contacts on a surface of the microdisplay chip; forming a second plurality of electrical contacts on the particular front surface of the package substrate; and forming a plurality of electrical connections, each between a particular one of the first plurality of electrical contacts and a particular one of the second plurality of electrical contacts.

18. The method of any of examples 1 to 17, wherein each of the vias is coupled to a particular one of the second plurality of electrical contacts.

19. The method of any of examples 1 to 18, further comprising: forming an adhesive along an edge of the package substrate; and affixing the adhesive to a portion of the flexible flat circuit connector, such that the flexible flat circuit connector is configured to bend around a side surface of the package substrate that is perpendicular to the particular front surface of the package substrate; wherein the flexible flat circuit connector extends beyond the particular front surface of the package substrate in a direction substantially perpendicular to the particular front surface of the package substrate.

Any or all of the features and functions described above can be combined with each other, except to the extent it may be otherwise stated above or to the extent that any such embodiments may be incompatible by virtue of their function or structure, as will be apparent to persons of ordinary skill in the art. Unless contrary to physical possibility, it is envisioned that (i) the methods/steps described herein may be performed in any sequence and/or in any combination, and that (ii) the components of respective embodiments may be combined in any manner.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A microdisplay module comprising:
a package substrate;
a microdisplay chip disposed over a front surface of the package substrate;
a plurality of conductive vias electrically coupled to the microdisplay chip and disposed through the package substrate to a back surface of the package substrate;
a flexible flat circuit connector coupled to the plurality of conductive vias at the back surface of the package substrate;
a first plurality of electrical contacts disposed on a surface of the microdisplay chip that is parallel to the front surface of the package substrate;
a second plurality of electrical contacts disposed on a particular surface of the package substrate, wherein the particular surface is the front surface or another surface of the package substrate that is parallel to the front surface, wherein each of the vias is coupled to a particular one of the second plurality of electrical contacts; and
a plurality of electrical connections, each connected between a particular one of the first plurality of electrical contacts and a particular one of the second plurality of electrical contacts;
an encapsulant layer disposed along an edge of the particular surface of the package substrate, the encapsulant layer adhering to the flexible flat circuit connector such that the encapsulant layer holds the flexible flat circuit connector in a configuration in which the flexible flat circuit connector bends around an edge of the package substrate at which a side surface of the package substrate meets the back surface of the package substrate, the side surface being perpendicular to the front and back surfaces of the package substrate, such that a portion of the flexible flat circuit connector is held by the encapsulant layer substantially parallel to and proximate to the side surface of the package substrate, wherein a portion of the flexible flat circuit connector extends beyond a top surface of the microdisplay chip in a direction substantially perpendicular to the front surface of the package substrate.

2. The microdisplay module of claim 1, wherein the microdisplay chip is an LCOS chip.

3. The microdisplay module of claim 1, wherein the package substrate comprises a ceramic substrate.

4. The microdisplay module of claim 1, wherein the flexible flat circuit connector is coupled to the plurality of conductive vias by a plurality of ACF pads.

* * * * *